(12) United States Patent
Thill

(10) Patent No.: US 6,370,674 B1
(45) Date of Patent: Apr. 9, 2002

(54) PROCESS FOR EVALUATING THE PERFORMANCE OF VERY HIGH SCALE INTEGRATED CIRCUITS

(75) Inventor: Michel Thill, Les Clayes sous Bois (FR)

(73) Assignee: Bull S.A., Louveciennes (FR)

( * ) Notice: Subject to any disclaimer, the term of this patent is extended or adjusted under 35 U.S.C. 154(b) by 0 days.

(21) Appl. No.: 09/233,939

(22) Filed: Jan. 20, 1999

(30) Foreign Application Priority Data

Jan. 22, 1998 (EP) .......................................... 98400134

(51) Int. Cl.⁷ .............................................. G06F 17/50
(52) U.S. Cl. ............................................. 716/4; 703/15
(58) Field of Search ................................ 716/4; 703/15

(56) References Cited

U.S. PATENT DOCUMENTS

| | | | | |
|---|---|---|---|---|
| 4,587,620 A | * | 5/1986 | Niimi et al. ................. | 364/574 |
| 5,285,470 A | * | 2/1994 | Schreiber ...................... | 27/30 |
| 5,481,695 A | * | 1/1996 | Purks ........................ | 395/500 |
| 5,502,644 A | | 3/1996 | Hamilton et al. | |
| 5,555,506 A | | 9/1996 | Petschauer et al. | |
| 5,568,395 A | | 10/1996 | Huang | |
| 5,687,088 A | | 11/1997 | Yasuhiro ..................... | 364/491 |
| 5,910,730 A | * | 6/1999 | Sigal ............................ | 326/24 |
| 6,169,436 B1 | * | 1/2001 | Marbot ........................ | 327/270 |

OTHER PUBLICATIONS

Chen et al., Test Generation in VLSI Circuits for Crosstalk Noise, 1998 Proceedings of International Test Conference, pp. 641–650, Oct. 1998.*

Takayasu Sakurai et al.: "Simple Expressions for Interconnection Delay, Coupling and Crosstalk in VLSI's", VLSI Design and CAD, Singapore, Jun. 11–14, 1991, vol. 4, No. SYMP 24, Jun. 11, 1991, Institute of Electrical and Electronics Engineers, pp. 2375–2378, 1XP000302885.

* cited by examiner

Primary Examiner—Matthew Smith
Assistant Examiner—A. M. Thompson
(74) Attorney, Agent, or Firm—Miles & Stockbridge P.C.; Edward J. Kondracki

(57) ABSTRACT

The components of performance analysis considered within the scope of the invention are, in particular, the determination of the speed at which a circuit or a circuit component can generate output signals from input signals, and the noise immunity of the circuit.

The process for evaluating the performance of a very high scale integrated circuit comprises:

a first step (E1) in which, for each lead ($L_i$) of said circuit, an equivalent coupling capacity value ($C_{Ti}$) relative a fixed potential, is generated as being a sum of the existing real coupling capacity values ($C_{ij}$) of leads ($L_j$) of said circuit with said lead ($L_i$), each of which is assigned a weighting coefficient ($K_{ij}$); and a second step (E2) following said first step (E1), in which a switching time interval ($[t_{id}, t_{if}]$) in each lead ($L_i$) is generated as being a function of said equivalent capacity ($C_{Ti}$).

The fixed potential may be ground.

26 Claims, 8 Drawing Sheets

PROCESS FOR EVALUATING THE PERFORMANCE OF VERY HIGH SCALE INTEGRATED CIRCUITS

FIELD OF THE INVENTION

The field of the invention is that of the performance analysis of electric circuits. The components of performance analysis considered within the scope of the invention are, in particular, the determination of the speed at which a circuit or circuit component can generate output signals from input signals and the noise immunity of the circuit.

BACKGROUND OF THE INVENTION

A digital data processing circuit is normally constituted by flip-flops which store a stable state of signals, and by logic gates which connect these flip-flops by means of electric leads in order to perform logical combinations of these signals. Clock edges trigger the sending of these signals as output signals from some flip-flops and their reception as input signals by other flip-flops. After the sending of output signals from flip-flops at one clock leading edge, it is necessary for the inputs of the other flip-flops downstream to be switched to a stable state before the next clock edge. The switching instant in the input of another flip-flop depends on the speed at which the signals are propagated through the logic gates and through the leads that connect them to one another and to the flip-flops. This speed, and hence the switching instant, depends on the switching time specific to each gate and on the impedance properties of the leads: resistance, inductance and capacitance. Knowing the latest switching instant after a clock edge makes it possible to determine the shortest clock period allowable by the circuit. If the clock period is compulsory and the duration that separates a clock edge from the switching instant in the input of a flip-flop is longer than one clock period, it is necessary to change the structure of the circuit so as to reduce this duration to less than the clock period.

Even if the signals travel and combine quickly from one flip-flop memory to another, it is important for the values obtained to be as accurate as possible. One substantial source of error is the noise sensitivity of the components of the circuit. It is advantageous to evaluate the noise sensitivity of the circuit so that it can be redimensioned, if necessary, in order to increase its immunity to noise or simply ensure this immunity. The immunity of a circuit component is defined as being a change in an input voltage from a stable state that does not cause any change in the output voltage of this component. The immunity is directly related to the physical dimensions of the component. The noise level is generally obtained by multiplying the voltage difference between two stable states by the ratio of a crosstalk capacity to a total capacity of the input lead of this component.

The resistance, inductance and capacitance values of the components of a circuit are obtained from a connection list (or netlist) derived from the topological elements contained in the masks used to produce the circuit. For example, the resistance of a lead is directly proportional to its length and inversely proportional to its cross-section. The inductance of a lead is generally negligible in an integrated circuit. The capacitive effects require special precautions because for each lead, they depend on the surface area of this lead relative to the surface areas of other leads, on the distances that separate these surface areas and on the changes of the electrical loads in these other leads. In combination with the resistance of the lead, the capacitive effects constitute a determining factor in the time constant of this lead.

In order to determine this time constant in a simple way, it is common to reduce the effect of all the capacities between leads to that of a single capacity between the lead in question and a lead with a fixed potential, i.e., a lead that is not subject to any load change.

Recently, integrated circuits were produced by superposing conductive, semiconductive and insulating layers of sufficiently small thickness that the capacitive effects in a given lead of the circuit subject to load changes were essentially those caused by the capacities between the lead in question and the leads of fixed potential, constituted by the ground and the lead or leads for supplying power to the circuit. Therefore, it was sufficient to add these parallel capacities in question in order to reduce them to an equivalent capacity relative to the substrate of the circuit. The value of this capacity could be refined purely and simply by adding to it the coupling capacities with the other leads. In any case, these other signal-carrying leads of variable potential had coupling capacities that represented negligible quantities. An approximation was satisfactory.

The knowledge of this capacity relative to a fixed potential and of the resistance of the lead made it easy to determine a time constant as a function of the product of the capacity by the resistance, in each lead in question. It was then easy to deduce from this the switching instant or instant of the signals carried by this lead.

The current state of the art of using multilayered deposits to produce integrated circuits makes it possible to increase the thickness of the conductive layers in a direction perpendicular to the surface of the circuit, and to correspondingly reduce the thickness of the leads in the plane of the surface of the circuit, without reducing the cross-section of these leads, and hence without increasing the electrical resistance, or possibly even decreasing it. This makes it possible to considerably increase the level of integration of components per unit of area. On the other hand, the increase in the thickness of the insulating layers considerably reduces the coupling capacity between each lead in question and the leads of fixed potential. The effect of the coupling capacities between leads of variable potential no longer represents a negligible quantity relative to that of the coupling capacities with the leads of fixed potential, but on the contrary a predominant quantity. The approximation described in the paragraph above is no longer satisfactory.

Crosstalk is the physical phenomenon which, in a given electrical lead, causes a load change linked to a load change in another lead having a coupling capacity with the lead in question and which, reciprocally, causes in said other lead a load change linked to a load change in the lead in question. The known approximations of the prior art could lead to an overestimation or an underestimation of the time constants specific to each lead. An overestimation rung the risk of producing a conclusion that a functional circuit is not functioning. An underestimation runs the risk of not detecting a circuit's inability to function. It is possible to consider determining the time constants for each lead by mathematically solving the physical equations that govern the crosstalk phenomenon. This solution has proven to be prohibitive for a circuit comprising a large number of leads, since even though they are countable, the number of signal changes possible in a very high scale integrated circuit is nearly infinite. The determination of the switching instants, which is necessary to ensure that they remain within a clock cycle, therefore poses a problem. Moreover, crosstalk generates noise through the load changes it causes in a given lead, linked to load changes in other leads. An additional problem is posed by the need to evaluate the consequences of the crosstalk on the noise immunity of the circuit.

SUMMARY OF THE INVENTION

In order to mitigate the above-mentioned problems, the subject of the invention is a process for evaluating the performance of very high scale integrated circuits, characterized in that it comprises:

a first step in which, for each lead of said circuit, an equivalent coupling capacity value relative to a ground of fixed potential is generated as being a sum of the existing real coupling capacity values of other leads of said circuit with said lead, each of which is assigned a weighting coefficient;

a second step following said first step, in which a switching time interval in each lead is generated as being a function of said equivalent capacity.

A first advantage of the invention is that it leads to a simple solution by introducing weighting coefficients, which can advantageously be parameterized to take into account the structure of the circuit. The time constants are then produced in a conventional way. The weighting coefficients can have constant values, predetermined by means of statistical considerations or various precalculations.

Another solution is to define the weighting coefficients as having variable values.

An additional advantage is obtained when the process for evaluating the performance of very high scale (VHS) integrated circuits comprises a third step which precedes said first step, in which each of the coefficients is generated as being equal to:

a unit value in the absence of information according to which a switching time interval in another lead having an existing real coupling capacity with the lead in question has a part in common with the switching time interval in the lead in question;

a value higher than said unit value in the presence of information according to which a switching time interval in another lead having an existing real coupling capacity with the lead in question has a part in common with the switching time interval in the lead in question, and in the absence of information according to which the switching occurs at an identical value for the lead in question and the other lead in said common part;

a value lower than said unit value in the presence of information according to which a switching time interval in another lead having an existing real coupling capacity with the lead in question has a part in common with the switching time interval in the lead in question, and in the presence of information according to which the switching occurs at an identical value for both leads in said common part.

Thus, an additional interaction of the process with a behavior similar to the real behavior of the circuit is obtained, with even greater precision when the quantity of information on this real behavior is significant. A lack of precise information on the real behavior of the circuit does not preclude the implementation of the third step. By looping the second step to the third step, it is possible, for example, to add to the quantity of information available in the third step. Various reiterations of the three steps then make it possible to more closely emulate the real behavior of the circuit.

Another subject of the invention is a device specifically adapted to the implementation of the performance evaluation process and to the use of the performance evaluation process to produce fast circuits with very high scale integration.

BRIEF DESCRIPTION OF THE DRAWINGS

Other details of the invention will be better understood with the aid of the description of a preferred embodiment of the invention, an example of which is given below, in reference to the following figures wherein.

DESCRIPTION OF THE PREFERRED EMBODIMENTS

Figure 1A:
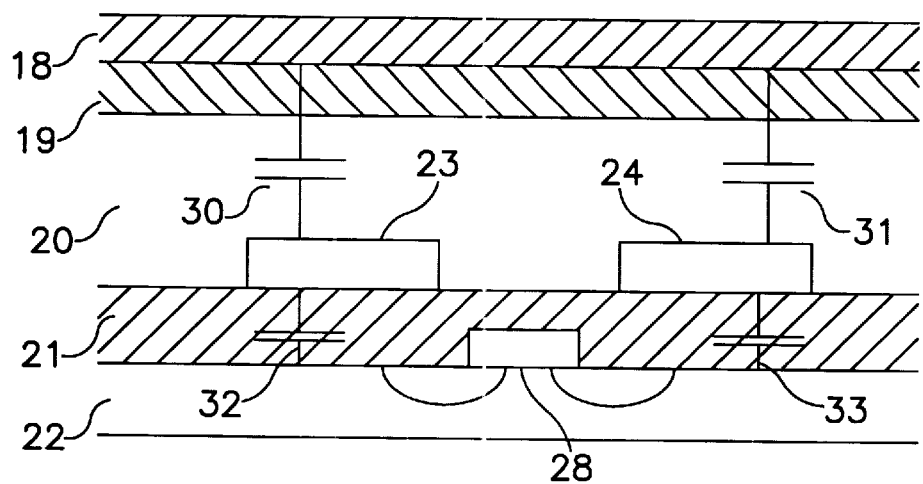
FIG. 1a shows a schematic cross-section of a high scale integrated circuit such as would normally have been encountered up to the present time.

FIG. 1a shows a schematic cross-section of a high scale integrated circuit such as would normally have been encountered up to now. On a polycrystalline substrate 22, microcomponents 28 such as diodes, resistors or transistors are produced in an oxide layer 21. The layer 21 is surmounted by a metallic layer 20 in which run lead sections 23, 24. The layer 20 is surmounted by an oxide layer 19, covered by a metallic layer 18 set at a fixed potential Vss or Vdd. The layers described above can be superposed repeatedly to obtain multilayered circuits. The lead section 23 has a coupling capacity 30 with the metallic layer 19 and a coupling capacity 32 with the substrate 22. The lead section 24 has a coupling capacity 31 with the metallic layer 19 and a coupling capacity 33 with the substrate 22. The height of the sections 23, 24 is small enough and the lead sections 23, 24 are far enough apart in comparison to the slight thickness of the layers 19 and 21 to render any coupling capacity between the lead sections 23, 24 negligible given the coupling capacities 30, 31, 32, 33. Since the layers 18 and 22 each have a fixed potential, for example Vss and Vdd, the sum of the capacities 30, 32 is normally reduced to an equivalent capacity Cs relative to the substrate.

Figure 1B:
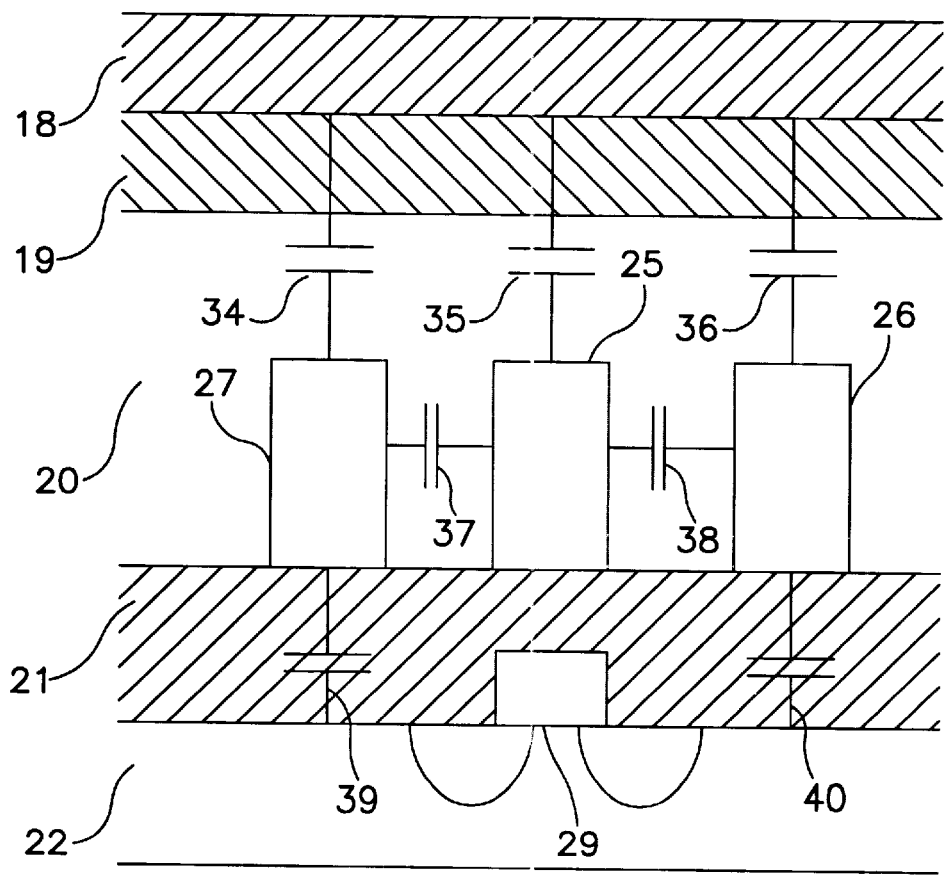
FIG. 1b shows a schematic cross-section of a high scale integrated circuit that can be produced using the current technologies for multilayered deposits.

FIG. 1b shows a schematic cross-section of high scale integrated circuit that can be produced using the current technologies for multilayered deposits. These technologies offer the possibility of increasing the thickness of the layers 18 through 21. By reducing the width of the lead sections 25, 26, 27 it is possible to increase the level of integration of electrical leads per unit of surface area. This integration level is further increased by the possibility of reducing the distances between leads. By increasing the height of the lead sections 25, 26, 27 it is possible to reduce their electrical resistance so that the current densities that flow through them are at least equal to those flowing through the sections 23, 24 shown in FIG. 1a. The increase in thickness of the oxide layers 19 and 21 has the effect of reducing the coupling capacity values 39, 40 of the leads with the substrate 22. The coupling capacity values 37, 38 between the lead sections 25 and 27 and between the lead sections 25 and 26, respectively, are no longer negligible and can even have a preponderant effect In FIG. 2, a lead 1 is intended to transmit logical signals from an emitter 5 to a receiver 4. Likewise, leads 2 and 3 are intended to transmit logical signals from emitters 6 and 7, respectively, to receivers not represented. The lead 1 has a coupling capacity $C_{1S}$ with the fixed reference potentials Vss and Vdd of the circuit. In addition, the lead 1 having the resistance $R_1$ has a coupling capacity $C_{12}$ and a coupling capacity $C_{13}$, with the lead 2 and the lead 3, respectively. When the emitter 5 switches at an instant t0 to a new potential value different from that preceding the instant t0, the lead 1 reaches the new potential value at a time constant that depends on the resistance of the lead 1 and on the charging current of each of the coupling capacities of the lead 1 with the other components of the circuit.

Figure 2:
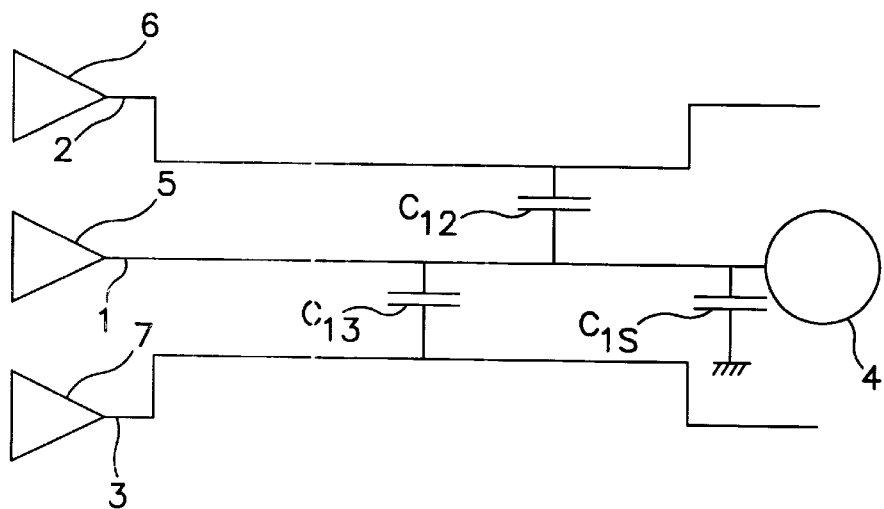
FIG. 2 shows a simplified example of electrical leads with coupling capacities.

FIG. 3 illustrates various potential changes in the lead 1 as a function of the electrical state in the diagram of FIG. 2.

Figure 3A:
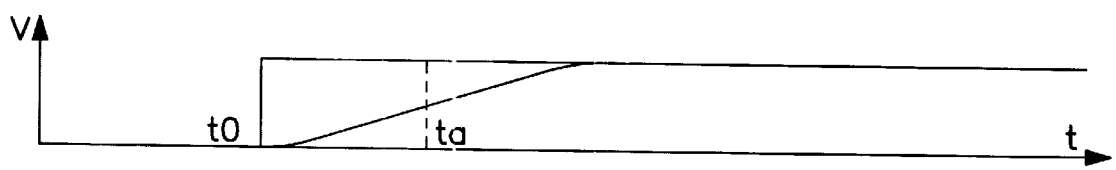
FIG. 3 illustrates various potential changes in a lead as a function of the electrical state in the diagram of FIG. 2.

FIG. 3a) represents the case in which, from the instant t0 at which the emitter switches to the new potential value to an instant ta when the reaching of a threshold voltage causes a switching of the receiver 4, the potential values of the leads 2 and 3 are constant. The lead has a capacity $C_T$ equal to the sum of the capacities $C_{12}$, $C_{13}$ and $C_{1S}$, disposed in parallel. The resistance $R_1$ defines a time constant such that its potential value reaches the switching threshold of the receiver 4 at the instant ta.

Figure 3B:
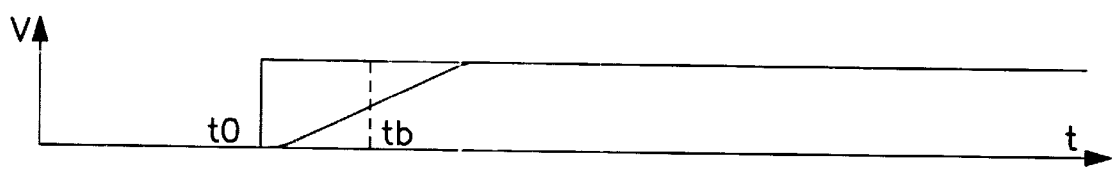

FIG. 3b) represents the case in which, from the instant t0 at which the emitter 5 switches to the new potential value to an instant tb when the reaching of a threshold voltage causes a switching of the receiver 4, the potential values of the leads 2 and 3 change in a way identical to that of the lead 1. This extreme case occurs, for example, when the emitters 6 and 7 switch at the same instant t0 as the emitter 5. The potential difference in the terminals of the capacities $C_{12}$ and $C_{13}$ remains null at all times, and therefore the latter do not change their loads. Everything occurs as though these capacities did not exist. Therefore, the lead has a capacity $C_T$ equal to the capacity $C_{1S}$. The resistance $R_1$ defines a time constant such that the potential value of the lead 1 reaches the switching threshold of the receiver 4 at the instant tb. The instant tb precedes the instant ta of the preceding case, since the apparent capacity $C_T$ of the lead 1 is smaller. FIG. 3b) represents the case in which the receiver 4 switches with a minimal delay tb−t0 after the switching of the emitter 5, since only the capacity $C_{1S}$ affects the time constant.

Figure 3C:
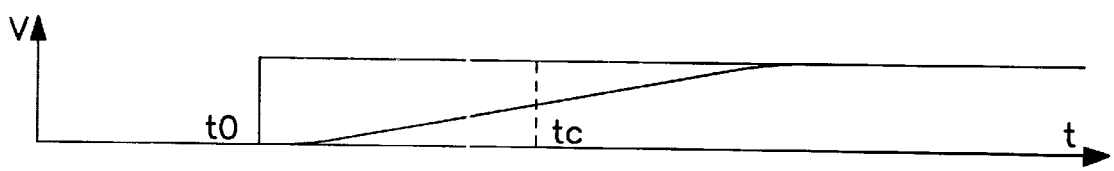

FIG. 3c) represents the case in which, from the instant t0 at which the emitter 5 switches to the new potential value to an instant tc at which the reaching of a threshold voltage causes a switching of the receiver 4, the potential values of the leads 2 and 3 change in the opposite way from the lead 1. This extreme case occurs, for example, when the leads 2 and 3 have an inverse initial potential value, and when the emitters 6 and 7 switch at the same instant t0 as the emitter 5. Everything occurs approximately as though the capacities $C_{12}$, $C_{13}$ had a value double their real value. Therefore, the lead has a capacity $C_T$ equal to the capacity $C_{1S}$, to which is added the double of the sum of the capacities $C_{12}$, $C_{13}$. The resistance $R_1$ defines a time constant such that the potential value of the lead 1 reaches the switching threshold of the receiver 4 at the instant tc. The instant tc occurs after the instant ta of the first case, since the apparent capacity $C_T$ of the lead 1 is larger. FIG. 3c) represents the case in which the receiver 4 switches with a maximal delay tc−t0 after the switching of the emitter 5, since only the capacities between leads have the effect of approximately double their values on the time constant.

Between the extreme cases illustrated in FIGS. 3b) and 3c), an infinite number of cases can occur, in which the instant when the reaching of a threshold voltage causes a switching of the receiver 4 occurs during the interval [tb, tc]. For example, if upon the switching of the emitter 5, the emitter 6 does not switch and the emitter 7 switches in the opposite direction, then $C_T=C_{1S}+C_{12}+2*C_{13}$.

On the other hand, between the case in which a coupling capacity has the effect of a null value and that in which it has the effect of a double value, it is especially important to remember that a coupling capacity has the effect of its real value if the other lead has a stable voltage value. The coupling capacity has the effect of a value smaller than its real value if the voltages in the two leads change in the same direction. The coupling capacity has the effect of a value larger than its real value if the voltages in the two leads change in opposite directions.

Figure 4:
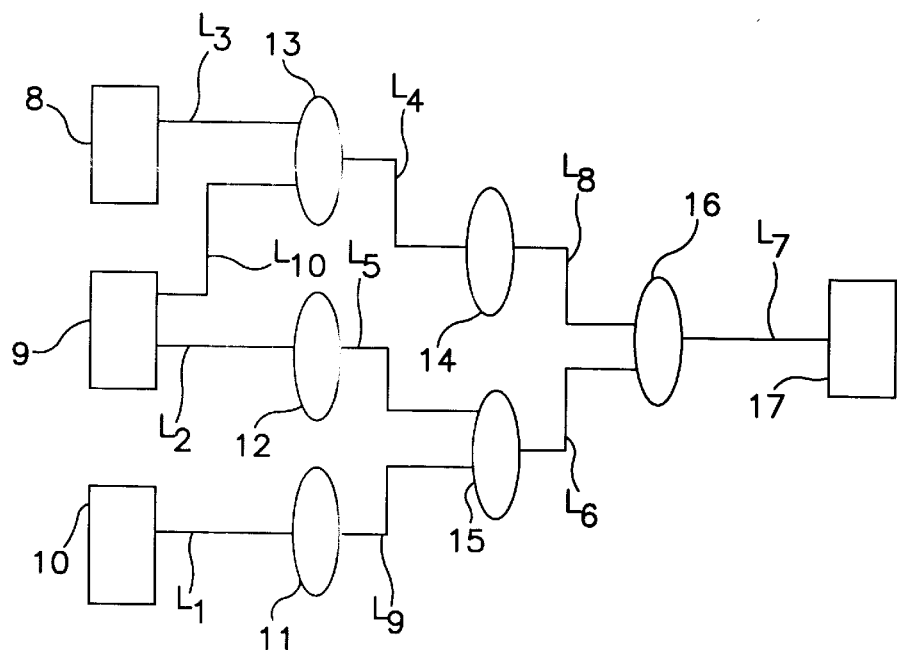
FIG. 4 shows an example of an elemental circuit within an integrated circuit.

FIG. 4 shows an example of an elemental circuit within an integrated circuit, for performing a logical combination of signals issued from input registers 8, 9, 19, the result of which is available in a register 17. To simplify the explanations, the term register is intended herein to mean any layout of one or more flip-flops. Nodes 11 through 16 are composed of transistors for obtaining from each node a binary output signal resulting from input signals in this node. The node 11 receives as input a signal issued from the register 10. The node 12 receives as input a signal issued from the register 9. The node 13 receives as input a signal issued from the register 8 and a signal issued from the register 9. The node 14 receives as input a signal issued from the output of the node 13. The node 15 receives as input a signal issued from the output of the node 11 and a signal issued from the output of the node 12. The node 16 receives as input a signal issued from the output of the node 14 and a signal issued from the output of the node 15. The output signal from the node 16 is received as input by the register 17.

Figure 5:
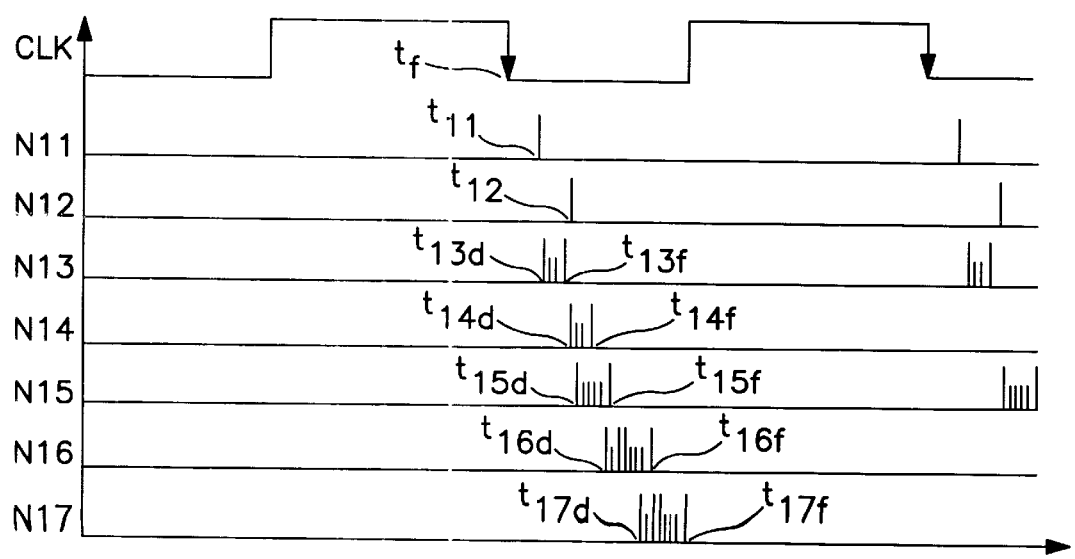
FIG. 5 is a timing diagram showing the instants at which a switching threshold is crossed.

FIG. 5 is a timing diagram showing time on the abscissa in order to represent, for each element 11 through 17 of FIG. 4, the instants at which the switching threshold is crossed, as described above in reference to FIG. 3, in the input of each of these elements.

The first line CLK represents the logical state of a clock in which, for example, the trailing edge at an instant $t_f$ determines the sending of a binary output signal from the registers 8 through 10.

On the line N11, the signal sent from the register 10 is capable of causing a switching of the node 11 on input at an instant $t_{11}$. The delay $t_{11}-t_f$ results from the coupling capacities of the lead connecting the output of the register 10 to the input of the node 11, as explained above in reference to FIGS. 2 and 3.

On the line N12, the signal sent from the register 9 is capable of causing a switching of the node 12 on input at an instant $t_{12}$. The delay $t_{12}-t_f$ results from the coupling capacities of the lead connecting the output of the register 9 to the input of the node 12, as explained above in reference to FIGS. 2 and 3.

On the line N13, the signal sent from the register 8 is capable of causing a switching of the node 13 on input at an instant $t_{13d}$. The delay $t_{13d}-t_f$ results from the coupling capacities of the lead connecting the output of the register 8 to the input of the node 13, as explained above in reference to FIGS. 2 and 3. The signal sent from the register 9 is capable of causing a switching of the node 13 on input at an instant $t_{13f}$. The delay $t_{13f}$-$t_f$ results from the coupling capacities of the lead connecting the output of the register 9 to the input of the node 13. Between the instants $t_{13d}$ and $t_{13f}$, the switching of the node 13 is indeterminate. This indeterminacy is symbolized by the small vertical hatching.

On the line N14, the indeterminacy of the switching of the node 13 is carried over as input to the node 14 from $t_{14d}$ to $t_{14f}$. The delay $t_{14d}$-$t_{14f}$ results from the coupling capacities of the lead connecting the output of the node 13 to the input of the node 14 and from the intrinsic switching time of the node 13.

On the line N15, the signal sent from the node 11 is capable of causing a switching of the node 15 on input at an instant $t_{15d}$. The delay $t_{15d}$-$t_{11}$ results from the coupling capacities of the lead connecting the output of the node 11 to the input of the node 15 and from the intrinsic switching time of the node 11. The signal sent from the node 12 is capable of causing a switching of the node 15 on input at the instant $t_{15f}$. The delay $t_{15f}$-$t_{12}$ results from the coupling capacities of the lead connecting the output of the node 12 to the input of the node 15 and from the intrinsic switching time of the node 12. Between the instants $t_{15d}$ and $t_{15f}$, the switching of the node 15 is indeterminate. This indeterminacy is symbolized by the small vertical hatching.

On the line N16, the indeterminacy of the switching of the node 14 and the indeterminacy of the switching of the node 15 are carried over as input to the node 16 from $t_{16d}$ to $t_{16f}$. The delay $t_{16d}$-$t_{14d}$ results from the coupling capacities of the lead connecting the output of the node 14 to the input of the node 16 and from the intrinsic switching time of the node 14. The delay $t_{16f}$-$t_{15f}$ results from the coupling capacities of the lead connecting the output of the node 15 to the input of the node 16 and from the intrinsic switching time of the node 15.

On the line N17, the indeterminacy of the switching of the node 16 is carried over as input to the register 17 from $t_{17d}$ to $t_{17f}$. The delay $t_{17d}$-$t_{16d}$ results from the coupling capacities of the lead connecting the output of the node 16 to the input of the register 17 and from the intrinsic switching time of the node 16.

The preceding explanations hold true for each trailing edge of the clock signal CLK as seen on the right-hand side of the timing diagram.

Figure 6:
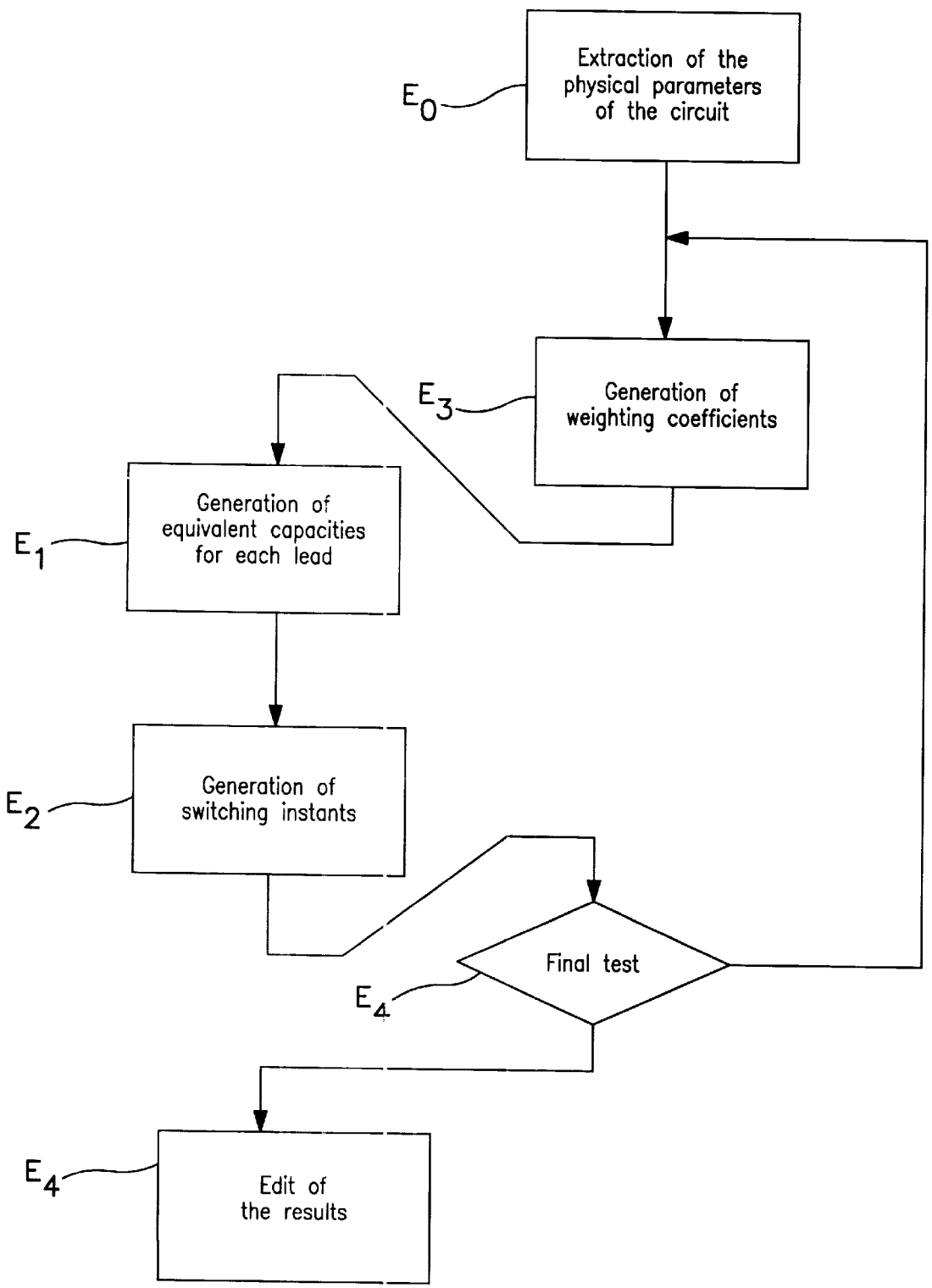
FIG. 6 illustrates a process for obtaining the switching instants of the components of an electrical circuit.

FIG. 6 illustrates a process for obtaining the switching instants of the components of an electric circuit.

In step E0, the physical parameters of the circuit are extracted, for example from production masks which constitute a true image of the circuit produced from these masks. These physical parameters are listed in a connection list (netlist). The extraction from the masks is not necessary if there is already a netlist comprising, for each electrical lead $L_i$ of the circuit, the values of its resistance $R_i$ and of the existing real coupling capacities $C_{ij}$ with the other leads $L_j$, which include the ground with the fixed potential Vss and the power supply leads with the fixed potential Vdd.

In step E1, for each lead $L_i$ of the circuit, an equivalent coupling capacity value $C_{Ti}$ relative to a ground of fixed potential is generated. A device, for example a computer, calculates a sum of the existing real coupling capacity values $C_{ij}$ of leads $L_j$ of the circuit with the lead $L_i$. Each capacity $C_{ij}$ is assigned a weighting coefficient $K_{ij}$.

A step E2 follows step E1. A device, for example the computer used in step E1, generates a switching time interval $[t_{id},T_{if}]$ in each lead $L_i$. The switching time interval $[t_{id},T_{if}]$ generated is stored in a data structure for subsequent operations such as, for example, a simple edit of the results. In order to generate the switching time interval, the device calculates a time constant $\tau_i$ specific to the lead $L_i$, as a function of the equivalent capacity $C_{Ti}$ generated in step E1. A simple known function is $\tau_i$=$R_i$×$C_{ti}$. The switching instant $t_{id}$ is calculated as a function of the time constant $\tau_i$ and of the instant of the first sending of output from the emitter located upstream from the lead. The switching instant $t_{if}$ is calculated as a function of the time constant $\tau_i$ and of the instant of the last sending of output from the emitter located upstream from the lead. If these first and last sending instants are not already in the structure mentioned above, the device begins by generating them as a function of the switching instants of the leads located upstream from the emitter in question, and so on, as necessary, until it reaches the flip-flops where the signal changes originated. Each original emission occurs at a clock edge instant $t_f$. Values of $t_{id}$ and $t_{if}$ resulting strictly from a calculation do not necessarily correspond exactly to reality, so it is possible to retain a value of $t_{id}$ that is slightly lower than the calculated value and a value of $t_{if}$ that is slightly higher than the calculated value, in order to include the interval $[t_{id},t_{if}]$ with an acceptable margin of error.

In order to better adapt the weighting coefficients $K_{ij}$ to the behavior of the circuit, a step E3 for generating these weighting coefficients precedes step E1. A device equipped with digital data processing means scans each lead $L_i$ in the data structure available to it. The device then scans, in the data structure, each lead $L_j$ having an existing real coupling capacity $C_{ij}$ with the lead $L_i$ in question. For each pair of leads $L_i$, $L_j$, the device searches for the existence of a switching time interval $[t_{id},t_{if}]$ in the lead $L_i$ and a switching time interval $[t_{jd},t_{jf}]$ in the lead $L_j$ with a common part.

If the device does not detect any information on the existence of a common part, it assigns a unit value to the weighting coefficient $K_{ij}$. In this case there is no existing information according to which the lead $L_j$ behaves in any way other than as a lead having a fixed potential during a switching in the lead $L_i$. This is always the case for the leads having the fixed potential Vss or Vdd.

If the device detects information on the existence of a common part, it searches for whether the switching occurs at an identical value for the leads $L_i$ and $L_j$ in this common part. For example, it is possible for this second level of information to be available when the leads $L_i$ and $L_j$ are carrying the same signal.

In the absence of this second level of information, the device assigns the coefficient $K_{ij}$ a value higher than the unit value. In this case, there is no existing information according to which a load change of the lead $L_j$ does not coincide with a load change of the lead $L_i$. However, in a performance evaluation, it is preferable to consider the most unfavorable case. Based on the teaching provided in reference to FIG. 3, a simple choice for the value of the coefficient $K_{ij}$ is a double value.

In the presence of this second level of information, the device assigns the coefficient $K_{ij}$ a value lower than the unit value. In this case, there is in fact existing information according to which a load change of the lead $L_j$ does not coincide with, or even contribute to a load change of the lead $L_i$. However, in a performance evaluation, it is preferable to take into account a favorable case in order not to grossly underestimate this performance. Given the teaching provided in reference to FIG. 3, a simple choice for the value of the coefficient $K_{ij}$ is a null value.

Step E3 is even more effective when the quantity of information it has on the switching intervals is significant. Step E2 generates switching intervals that it is advantageous to use in step E3. An improvement of the process described is comprised of looping the output of step E2 back to the input of step E3. A final test step E4 is interposed between the steps E2 and E3, making it possible to leave the loop thus constituted by the steps E1 through E3 via E4 as shown in the drawing.

Step E4 constitutes a final test, which in case of a break in the loop, leads to a step E4 for editing the switching intervals generated in step E2. Various tests can be provided in step E4. For example, it is possible to use the incrementation of a counter with each entry into step E4 and to trigger an end signal when the content of this counter exceeds a predetermined threshold value. It is also possible to compare one or more switching instants, for example the latest one after the clock edge, generated before the previous branching to step E3, to the one generated at the output of step E2, and to trigger an end signal if the two instants do not differ by more than a predetermined quantity. Any conceivable test are possible without going outside the scope of the present invention.

It is possible to provide for the series of steps E3 and E2 to occur after having systematically scanned all of the leads of the circuit in each of the steps E3, E1, E2. It is also possible to provide for the sequence of steps E3 through E2 to occur after having scanned the leads having a coupling capacity with a given lead. The loops through the step E4 then occur step by step until all of the leads in the circuit have been scanned.

We will now see how the process described in reference to FIG. 6 can work in a circuit of the type described in reference to FIG. 4.

In step E0, each of the leads $L_i$, $L_j$, whose subscripts i and j vary from 1 to the total number of leads in the circuit, ten in the case illustrated in FIG. 4, is listed in a data structure with its physical characteristics.

In the passage from step E0 to step E3, no switching interval is known a priori. Therefore, in step E3, the weighting coefficients are all initialized at a unit value.

In step E1, the coupling capacity of each lead is then calculated using a first approximation comprised of assuming that, when a given lead $L_i$ switches, no other adjacent lead $L_j$ switches. As explained in reference to FIGS. 2 and 3, the total coupling capacity $C_{Ti}$ relative to the substrate is equal to the sum of the real coupling capacity with the substrate $C_{Si}$ and the coupling capacities $C_{ij}$ of the lead $L_i$ with the n adjacent leads $L_j$.

$$C_{Ti} = C_{Si} + \Sigma C_{ij} (j \neq i, j \text{ running from } 1 \text{ to } n, n \leq 10)$$

In step E2, the switching instants and intervals that follow a given clock edge instant $t_f$ are calculated for each node of the circuit analyzed, in a model according to the explanations of FIG. 3, from the capacity $C_{Ti}$ calculated in step E1. Thus, results similar to those of FIG. 5 are obtained.

Step E4 then branches the process back to step E3, in which the weighting coefficients are recalculated.

The combination of steps E3 and E1 again generates a capacity $C_{Ti}$ for each lead joining two nodes, using the preceding results of step E2. Take for example the case of FIG. 5.

In order to recalculate the capacity $C_{T1}$ of the lead L1, all the leads Lj with which the lead L1 has a coupling capacity $C_{1j}$ are considered. In the time interval $[t_{11}-t_f]$ for the sending of a signal through the lead L1, signals with unknown signs are sent through the leads L2, L10 and L3. No signal is sent through the leads L4 through L9. The maximum coupling capacity $C_{T1}$ is expressed by the formula:

$$C_{T1} = C_{S1} + 2(C_{12} + C_{13} + C_{110})$$

In order to recalculate the capacity $C_{T2}$ of the lead L2, all the leads Lj with which the lead L2 has a coupling capacity $C_{2j}$ are considered. In the time interval $[t_{12}-t_f]$ for the sending of a signal through the lead L2, a signal with the same sign is sent through the lead L10, signals with unknown signs are sent through the leads L1, L3, L4 and L9. No signal is sent through the leads L5 through L8. The maximum coupling capacity $C_{T2}$ is expressed by the formula:

$$C_{T2} = C_{S2} + C_{210} + 2(C_{21} + C_{23} + C_{24} + C_{29})$$

In order to recalculate the capacity $C_{T3}$ of the lead L3, all the leads Lj with which the lead L3 has a coupling capacity $C_{3j}$ are considered. In the time interval $[t_{13d}-t_f]$ for the sending of a signal through the lead L2, signals with unknown signs are sent through the leads L1, L2, L10 and L9. No signal is sent through the leads L4 through L8. The maximum coupling capacity $C_{T3}$ is expressed by the formula:

$$C_{T3} = C_{S3} + 2(C_{310} + C_{32} + C_{31} + C_{39})$$

And so on up to the lead L7.

Figure 7:
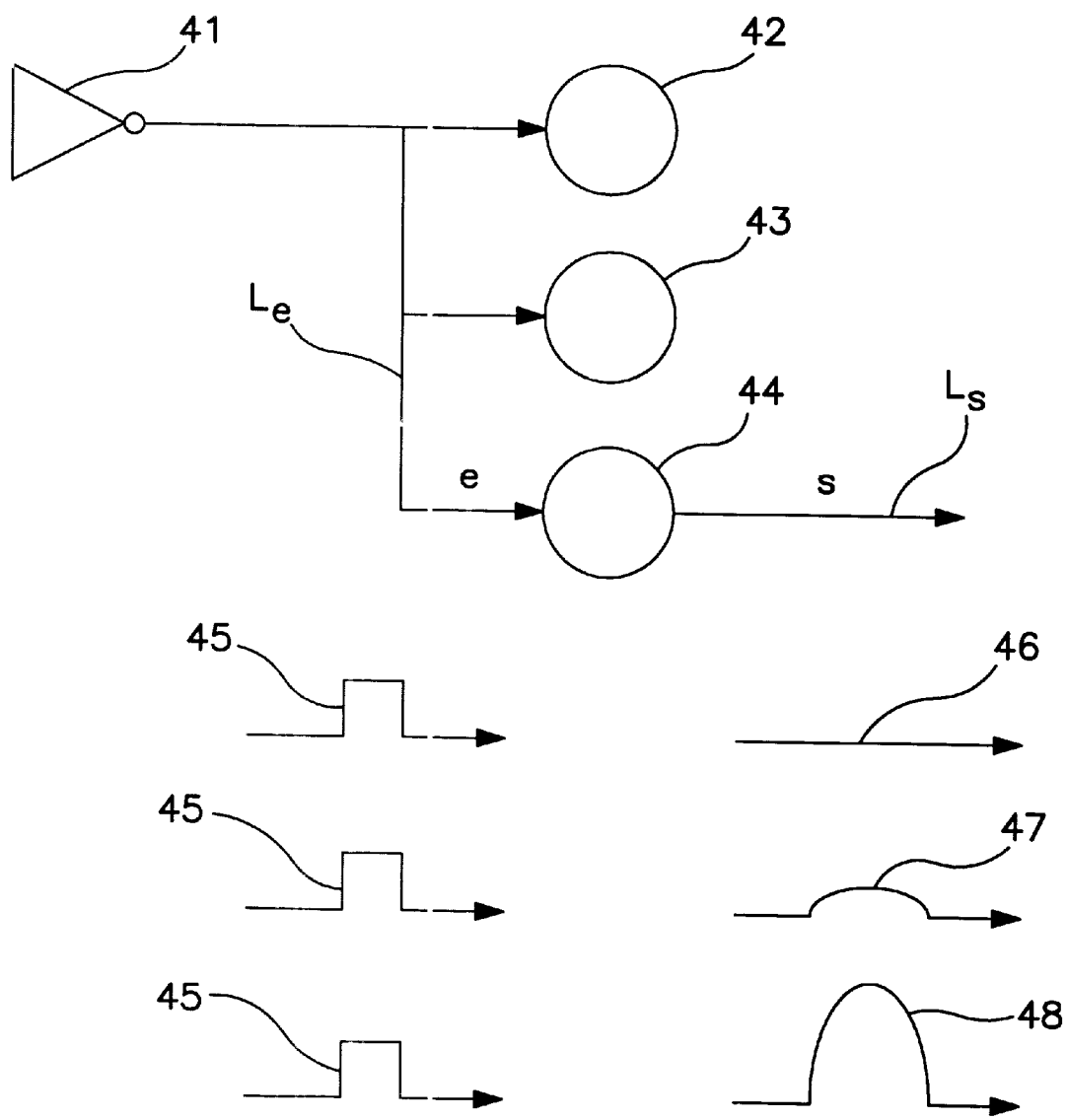
FIG. 7 shows various results of noise filtering by a circuit node.

FIG. 7 shows various possible noise resistance capabilities of a node 44. The node 44 acts like a receiver through an input e subjected to the voltage of a lead $L_e$. This voltage results from signals sent by a node 41, possibly sent to other nodes 42, 43. This voltage also results from noise transmitted through the lead $L_e$. The noise transmitted through the lead has various sources, supply voltage changes, crosstalk. Receiving a voltage as input, the node 44 then acts like an emitter of output s through a lead $L_s$. A noise 45 received as input is perfectly filtered if the change in the output voltage 46 from the node 44 that results from it is null. The noise 45 received as input is attenuated if the change in the output voltage 47 that results from it on output from the node 44, is lower than that of the noise 45. The noise 45 is amplified if the change in the output voltage 48 on output is higher than that of the noise 45. These explanations are valid for any receiver 42, 43 of the circuit. The node 41 constitutes an upstream emitter for the nodes 41 through 43.

Figure 8:
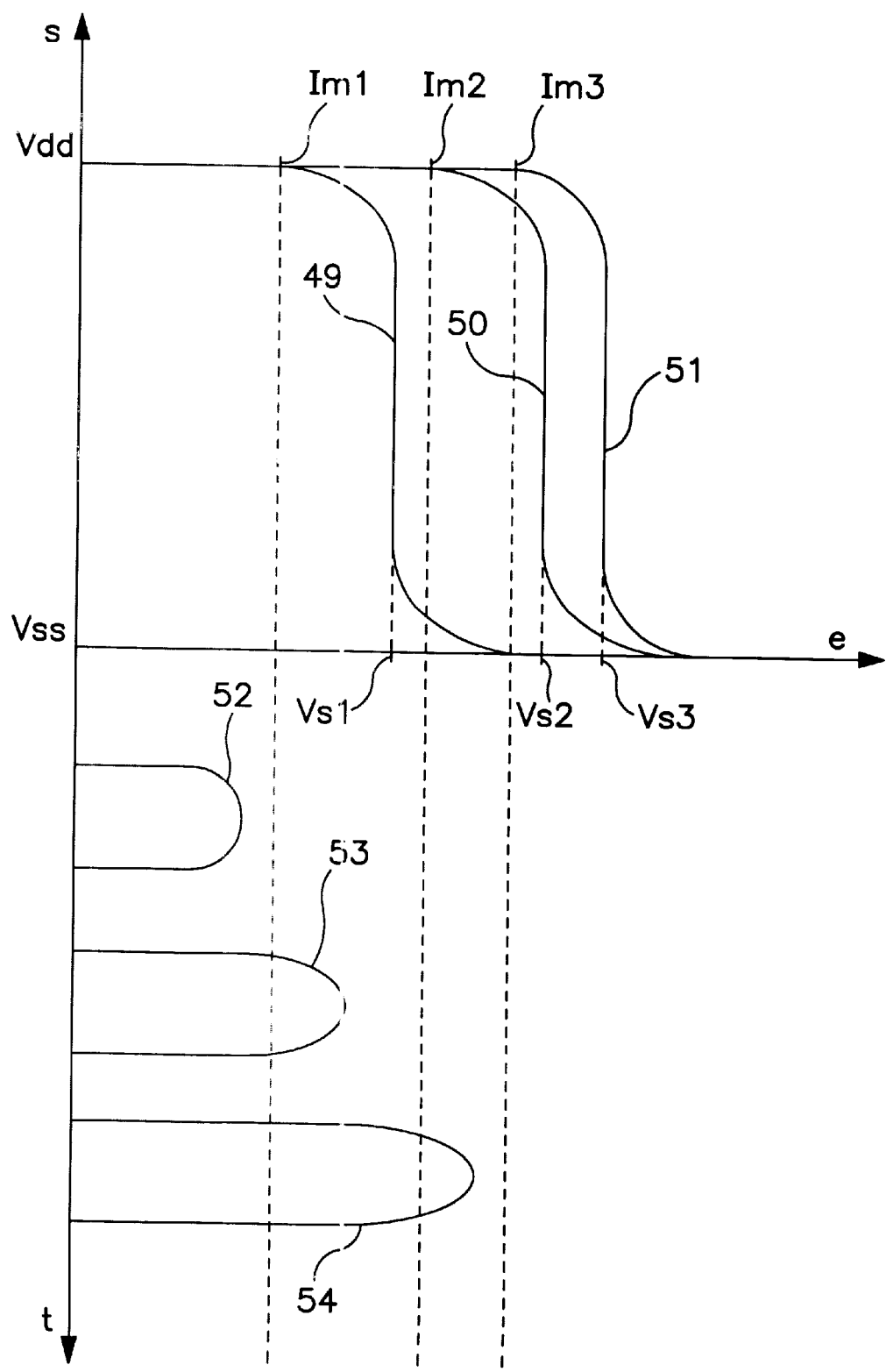
FIG. 8 illustrates the immunity of a circuit node.

FIG. 8 illustrates, in simplified fashion, various possible curves 49, 50, 51 of the change in the output voltage s, shown on the ascending ordinate, as a function of the input voltage e, shown on the abscissa, of the node 44, constituted in this example by an inverter. The vertical part of each of the curves 49, 50, 51 defines a respective switching threshold voltage Vs1, Vs2, Vs3, beyond which the output voltage s switches from the voltage Vdd to the voltage Vss. The immunity of the node 44 is the voltage value Im1, Im2, Im3 beyond which the output s deviates from its stable state voltage on the characteristic curve of the node.

Represented on the descending ordinate as a function of time t, are various noise voltages 52, 53, 54 in the input e. If the characteristic curve of the node is the curve 49, it is observed that a noise voltage level 52 lower than the voltage value Im1 leaves the output s in its stable state. The noise is perfectly filtered. On the other hand, a noise voltage level 53 higher than the voltage value Im1, causes the output s to deviate slightly from its stable state. The noise is attenuated. A noise voltage level 54 higher than the voltage value Vs1 causes a switching of the output to the potential Vss. The noise is amplified. By dimensioning the node 44 so that its characteristic curve is,the curve 50, the noise level 53 is perfectly filtered but the noise level 54 is only attenuated. By dimensioning the node 44 so that its characteristic curve is the curve 51, all three noise levels are perfectly filtered. In dimensioning the node 44, however, it is important not to overly increase the threshold voltage Vs3 in order not to lose its sensitivity for switching at a true signal in the node 44. Other solutions are comprised of lowering the noise level by increasing the power of the upstream emitting node 41, by reducing the resistance of the lead $L_e$, or by eliminating the source of this noise.

The capability of the lead $L_e$ to block an arrival of noise from an outside source is a function f(Pam, RL), where Pam is the emitting power of the upstream node 41 and RL is the resistance of the lead $L_e$. The higher the power Pam of the upstream emitting node and the lower the resistance RL of the lead, the more the capable the node is of generating current for cancel out, in the lead, the loads caused by noises from outside sources.

The noise Bu originated by crosstalk, to which the rest of the description refers, is calculated by the formula:

$$Bu = Vdd(C_D/C_T)$$

where $C_D$ is the crosstalk capacity and $C_T$ is the total capacity of the lead.

In a given time slot, the crosstalk capacity $C_D$ is the sum of the coupling capacities $C_{ej}$ of the lead $L_e$ with the leads $L_j$ during switching, insofar as the coupling capacities exist. The total capacity $C_T$ is the sum of the coupling capacities $C_{ei}$ of the lead $L_e$ with all the leads Li of the circuit, insofar as the coupling capacities exist.

A receiving node 44 is capable of resisting noise if its immunity Im satisfies the inequality:

$$Im > Bu/f(Pam, RL).$$

Figure 9:
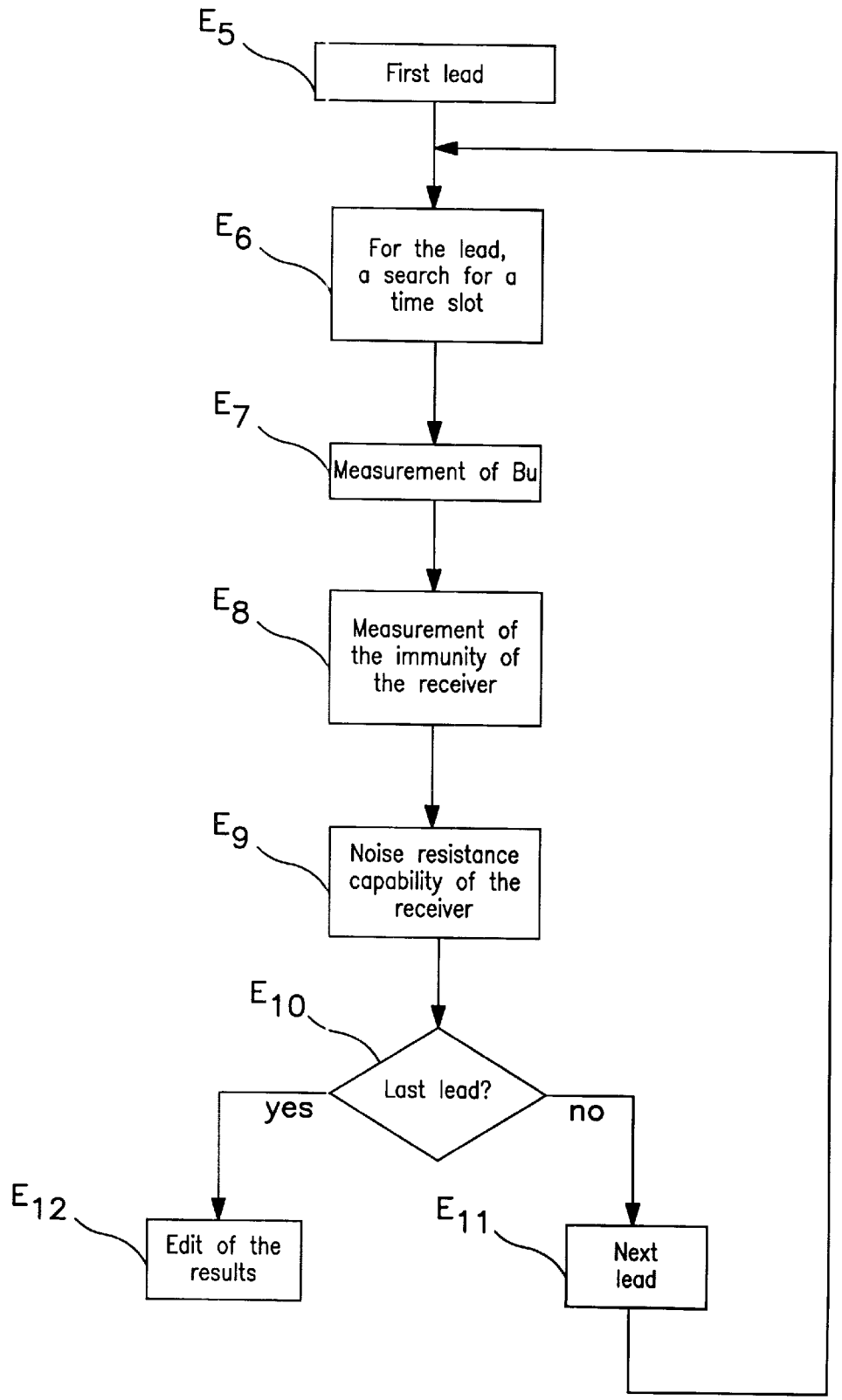
FIG. 9 illustrates a process for determining the switching nodes of an electric circuit whose immunity does not enable them to resist crosstalk noise.

FIG. 9 illustrates a process for determining the switching nodes of an electric circuit whose immunity does not enable them to resist crosstalk noise.

The process is initialized in step E5, in which a first lead $L_e$ of the circuit is scanned in the netlist.

Step E6 involves a search for a time slot in a clock cycle during which a greater number of leads $L_i$ having a coupling capacity $C_{ei}$ with the lead $L_e$ switch. The length of the time slot is inversely proportional to the capability f(Pam, RL) of the lead $L_e$, so that the upstream emitter has the time to cancel the loads caused by the switching of the leads $L_i$. The number of leads is determined by counting the leads $L_i$ that have switching instants in the time slot. These switching instants are, for example, those generated in step E2.

In step E7, a crosstalk capacity $C_{De}$ of the lead $L_e$ is calculated as being the sum of the coupling capacities $C_{ei}$ of the leads $L_i$ that switch during the time slot determined in step E6. The total capacity $C_{Te}$ of the lead $L_e$ is defined as being the sum of the coupling capacities $C_{ek}$ and of all the leads $L_k$ having one with the lead $L_e$ in question. The noise Bu in the lead $L_e$ is measured by the product of the supply voltage Vdd of the circuit with the ratio of the crosstalk capacity $C_{De}$ to the total capacity $C_{Te}$ of the lead $L_e$ in question.

Step E8 can be executed either before step E6, after step E7 or in parallel with steps E6 and E7. The netlist contains for each lead $L_e$ a list of one or more receiving nodes 42, 43, 44 branched from this lead, and for each receiver the value of its immunity Im. The receiving node with the lowest immunity value Im is retained.

In step E9, the immunity value retained in step E8 is compared with the ratio of the noise Bu to the function f(Pam, RL) of the lead $L_e$ in question. If the immunity Im is greater than the ratio Bu/f(Pam,RL), the noise Bu is perfectly filtered. If that is not the case, the switching node retained in step E8 has an immunity that does not enable it to resist crosstalk noise. The description of this node is then saved in a data structure.

In step E10, if the lead $L_e$ in question is the last lead in the netlist, the process ends with step E12. If not, the process continues in step E11, in which the next lead in the netlist is considered. Step E11 loops back to the steps E6 through E10.

In step E12, the data structure containing the nodes whose immunity does not enable them to resist crosstalk noise is edited. If the data structure is empty, it means that all the nodes of the circuit have an immunity that enables them to resist crosstalk noise.

Figure 10:
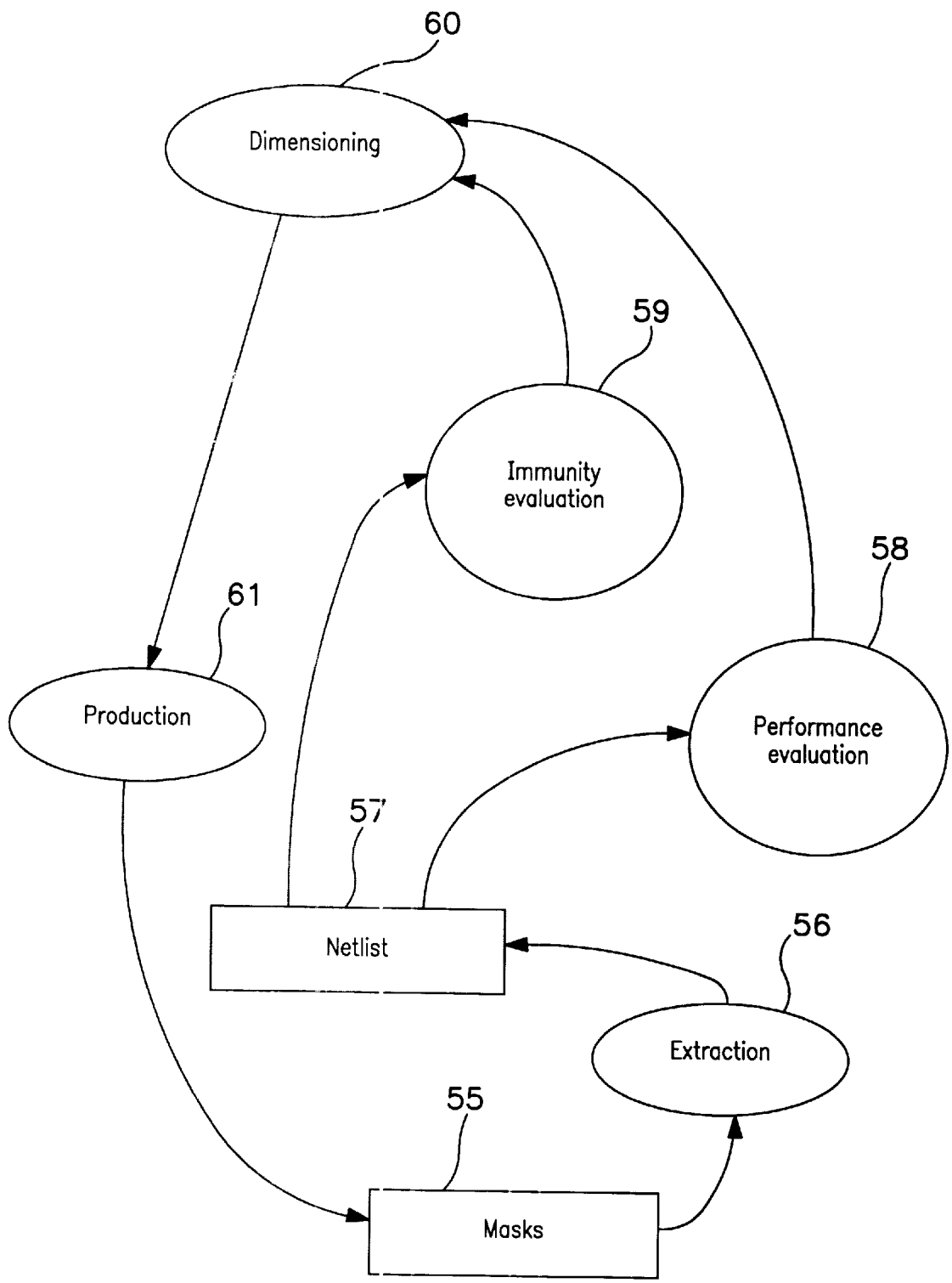
FIG. 10 illustrates a utilization of the invention in a process for producing fast circuits with high scale integration.

FIG. 10 illustrates a utilization of the invention in a process for producing fast circuits with high scale integration. An integrated circuit is commonly etched into a semiconductive material using masks 55. The masks 55 represent a true image of the physical structure of the circuit. An extraction phase 56 makes it possible to obtain from the masks a netlist 57 which contains, in the form of a computerized data structure, a list of all the leads of the circuit and the nodes that these leads connect to one another. The list also contains the physical characteristics of these leads and these nodes. These physical characteristics make it possible to determine, for example, the resistance RL and the coupling capacities of each lead, the switching threshold, the immunity and the emitting power of each node.

Using the netlist 57, a performance evaluation phase 58 advantageously uses steps E1 through E4 (FIG. 6). If there is no switching time interval edited in step E4 that exceeds one clock cycle, it is certain that the circuit achieves the performance objectives set for it in terms of speed. In the opposite case, the results of step E4 are used to redimension the circuit in a phase 60.

Using the netlist 57, an immunity evaluation phase 59 advantageously uses the steps E5 through E12. The immunity evaluation is comprised of determining the receiving node or nodes of the circuits whose immunity is too low to resist crosstalk noise. Associated with each of these nodes is the lead led upstream to its input. If there is no node edited in step E12 that contains any leads incapable of resisting crosstalk noise, it is certain that the circuit will not propagate crosstalk noise. In the opposite case, the results of step E13 are used to redimension the circuit in a phase 60. Phase 58 can precede phase 59, in order to take benefit from the switching instants generated in step E2.

If the phases 58 and/or 59 do nor produce satisfactory results as to the capability of the circuit to run fast enough and/or without propagating crosstalk noise, a dimensioning phase 60 provides for the following corrective actions. For each component implicated, lead or node, one or more of the following actions are proposed.

A first action is comprised of dimensioning the lead so as to reduce its resistance. This provides two advantages. The first advantage is that it reduces its time constant. The second advantage is that it increases its ability to supply a current for cancelling out parasitic loads caused by possible crosstalk noise.

A second action is comprised of modifying the layout of the circuit so as to decrease the coupling capacities with other leads of the circuit. This provides two advantages. The first advantage is that it reduces its time constant. The second advantage is that it reduces the causes of noise resulting from crosstalk.

A third action is comprised of dimensioning the receiving node branched downstream from the lead so as to increase its immunity Im.

A fourth action is comprised of dimensioning the sending node branched upstream from the lead in order to increase its power.

After phase 60, a production phase 61 generates new masks 55 which incorporate any dimensioning carried out in phase 60. It is possible to reiterate all or some of the phases 56 through 61 on the new masks thus generated until phase 60 is no longer necessary. The final masks generated in phase 61 make it possible to produce fast circuits with very high scale integration.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as set forth herein and defined in the claims.

What is claimed is:

1. A process for evaluating the performance of a very high scale (VHS) integrated circuit, comprising:

generating for each lead ($L_i$) of said circuit in a first step an equivalent coupling capacity value relative to a fixed potential, as a sum of the existing real coupling capacity values of all leads ($L_j$) of said circuit with said lead ($L_i$), each existing real coupling capacity value being assigned a weighting coefficient; and following said first step;

generating in each lead ($L_i$) in a second step a switching time interval that starts at a first instant with a delay from a first sending instant and ending at a second instant with said delay from a second sending instant in said lead, said delay being a function of said equivalent coupling capacity.

2. The process according to claim 1, further comprising a third step, which precedes said first step, and in which each weighting coefficient is equal to:

a first unit value when a switching time interval in the lead ($L_j$) having an existing real coupling capacity with the lead ($L_i$) has no part in common with the switching time interval in the lead ($L_i$);

a second value higher than said first unit value when a switching time interval in the lead ($L_j$) having an existing real coupling capacity with the lead ($L_i$) has a part in common with the switching time interval in the lead ($L_i$), and when the switching does not occur at an identical value for the leads ($L_i$) and ($L_j$) in said common part; and a third value lower than said first unit value when a switching time interval in the lead ($L_j$) having an existing real coupling capacity with the lead ($L_i$) has a part in common with the switching time interval in the lead ($L_i$), and when the switching takes place at an identical value for the leads ($L_i$) and ($L_j$) in said common part.

3. The process according to claim 1, wherein the fixed potential is ground potential.

4. The process according to claim 2, wherein said second value is equal to two and said lower third value is null.

5. The process according to claim 2, further comprising a fourth step for testing whether or not the process is closed and, if not, for looping the output of said second step back to the input of said third step.

6. A device for evaluating the performance of a very high scale integrated circuit, comprising:

first means for calculating, for each lead ($L_i$) of said circuit, an equivalent coupling capacity value relative to a fixed potential, as a sum of existing real coupling capacity values of all leads ($L_j$) of said circuit with said lead ($L_i$), each existing real coupling capacity value being assigned a weighting coefficient; and second means for calculating for each lead ($L_i$) a switching time interval that starts at a first instant with a delay from a first sending instant and ending at a second instant with said delay from a second sending instant in said lead ($L_i$), said delay being a function of said equivalent capacity.

7. The device according to claim 6, further comprising:

means for generating first information when a switching time interval in the lead ($L_j$) having an existing real coupling capacity with the lead ($L_i$) has a part in common with the switching time interval in the lead ($L_i$), and a second information when the switching occurs at an identical value for the leads ($L_i$) and ($L_j$) in said common part, and third means for calculating each weighting coefficient as being equal to:

a first unit value when the first information is not generated;

a second value higher than said first unit value when the first information is generated and the second information is not generated; and a third value lower than said first unit value when the first and second information are generated.

8. The device according to claim 6, wherein the fixed potential is ground potential.

9. The device according to claim 7, wherein said second higher value is equal to two and said third lower value is null.

10. The device according to claim 7, further comprising a fourth means for testing whether or not the output of said second means is to loop back to the input of said third means.

11. A process for evaluating the capability of a very high scale (VHS) integrated circuit to resist crosstalk noise, comprising the steps of:

searching for a clock cycle time slot for each lead ($L_e$) of the circuit, in which a greater number of switching time intervals occur in leads ($L_i$) having a coupling capacity with the lead ($L_e$), each switching time interval starting at a first instant and ending at a second instant with said delay from a second sending instant in the corresponding lead ($L_i$), said delay being a function of an equivalent coupling capacity; and determining the capability of a receiver having an input connected to the lead ($L_e$) to resist crosstalk noise caused by the leads ($L_i$) in the lead ($L_e$) in said time slot.

12. The process according to claim 11, wherein the length of the time slot is inversely proportional to a function related to the corresponding lead ($L_e$) and adapted to resist occurrence of noise.

13. The process according to claim 11, wherein said receiver is one among several receivers that has the lowest immunity to noise.

14. The process according to claim 11, further comprising a step for measuring noise in proportion to a ratio of the sum of the coupling capacities of the leads ($L_i$) having a switching interval in said time slot, to the sum of all the existing coupling capacities with leads ($L_j$) of the circuit.

15. A process for producing an electric circuit, comprising:

produce masks representative of a true image of the circuit in a first phase;

evaluating the performance of the components of the masks in a second phase, in which a process is implemented for evaluating the performance of a very high scale (VHS) integrated circuit, and;

providing corrective action to dimension the components in a third corrective phase, and reiterating the first phase with the components dimensioned in the third phase.

16. The process according to claim 13 wherein the implemented process in the second phase includes a first step comprising:

generating for each lead ($L_i$) of said circuit in a first step an equivalent coupling capacity value relative to a fixed potential, as a sum of the existing real coupling capacity values of leads ($L_j$) of said circuit with said lead ($L_i$), each existing real coupling capacity value being assigned a weighting coefficient; and following said first step in each lead ($L_i$);

generating in each lead ($L_i$) in a second step a switching time interval as being a function of said equivalent coupling capacity.

17. The process according to claim 16 further comprising a third step, which precedes said first step, and in which each of the weighting coefficients generated is equal to:

a first unit value in the absence of information according to which a switching time interval in the lead ($L_j$) having an existing real coupling capacity with the lead ($L_i$) has a part in common with the switching time interval in the lead ($L_i$);

a second value higher than said first unit value in the presence of information according to which a switching time interval in the lead ($L_j$) having an existing real coupling capacity with the lead ($L_i$) has a part in common with the switching time interval in the lead ($L_i$), and in the absence of information according to which the switching occurs at an identical value for the leads ($L_i$) and ($L_j$) in said common part; and a third value lower than said first unit value in the presence of information according to which a switching time interval in the lead ($L_j$) having an existing real coupling capacity with the lead ($L_i$) has a part in common with the switching time interval in the lead ($L_i$), and in the presence of information according to which the switching takes place at an identical value for the leads ($L_i$) and ($L_j$) in said common part.

18. The process according to claim 16, wherein the fixed potential is ground potential.

19. The process according to claim 17, wherein said second value is equal to two and said lower third value is null.

20. The process according to claim 17, further comprising a fourth step repeating the third step after the second step, until a stop signal is obtained.

21. A process for producing a very high scale (VHS) integrated circuit comprising producing masks having components and representative of a true image of the circuit in a first phase, and evaluating at least one component of the masks in a second phase in which a process is implemented for evaluating the performance of the circuit, said process comprising:

generating for each lead ($L_i$) of said circuit in a first step, an equivalent coupling capacity value relative to a fixed potential, as a sum of the existing real coupling capacity values of leads ($L_j$) of said circuit with said lead ($L_i$), each existing real coupling capacity value being assigned a weighting coefficient; and following said first step generating in each lead ($L_i$) in a second step a switching time interval that starts at a first instant with a delay from a first sending instant and ending at a second instant with said delay from a second sending instant in said lead ($L_i$), said delay being a function of said equivalent capacity.

22. The process according to claim 21, wherein said second phase further implements a process for evaluating the capacity of the circuit to resist crosstalk noise, which includes:

searching for a clock cycle time slot for each lead ($L_e$) of the circuit, in which a greater number of switching time intervals occur in leads ($L_i$) having a coupling capacity with the lead ($L_e$), each switching time interval starting at a first instant with a delay from a first sending instant and ending at a second instant with said delay from a second sending instant in the corresponding lead ($L_i$), said delay being a function of said equivalent coupling capacity; and determining the capability of a receiver having an input connected to the lead ($L_e$) to resist crosstalk noise caused by the leads ($L_i$) in the lead ($L_e$) in said time slot.

23. The process according to claim 21, wherein the fixed potential is ground potential.

24. The process according to claim 21, wherein said second phase is used to provide corrective action to dimension the component in a third corrective phase.

25. A process for producing a very high scale (VHS) integrated circuit, comprising producing masks having components and representative of a true image of the circuit in a first phase, and evaluating at least one component of the masks in a second phase in which a process is implemented for evaluating the capacity of the circuit to resist crosstalk noise, which includes:

searching for a clock cycle time slot for each lead ($L_e$) of the circuit, in which a greater number of switching time intervals occur in leads ($L_i$) having a coupling capacity with the lead ($L_e$), each switching time interval starting at a first instant with a delay from a first sending instant and ending at a second instant with said delay from a second sending instant in the corresponding lead ($L_i$), said delay being a function of said equivalent coupling capacity; and determining the immunity of a receiver having an input connected to the lead ($L_e$) to crosstalk noise caused by the leads ($L_i$) in the lead ($L_e$) in said time slot.

26. The process according to claim 25, wherein said second phase is used to provide corrective action to dimension the component in a third corrective phase.

* * * * *

UNITED STATES PATENT AND TRADEMARK OFFICE
CERTIFICATE OF CORRECTION

PATENT NO. : 6,370,674 B1
DATED : April 9, 2002
INVENTOR(S) : Thill, Michel

It is certified that error appears in the above-identified patent and that said Letters Patent is hereby corrected as shown below:

<u>Column 15,</u>
Line 17, substitute "13" with -- 15 --;

Signed and Sealed this

Third Day of September, 2002

Attest:

Attesting Officer

JAMES E. ROGAN
*Director of the United States Patent and Trademark Office*